(12) United States Patent
Liu

(10) Patent No.: US 12,181,793 B1
(45) Date of Patent: Dec. 31, 2024

(54) MASK SYNTHESIS USING TENSOR-BASED COMPUTING PLATFORMS

(71) Applicant: Synopsys, Inc., Mountain View, CA (US)

(72) Inventor: Peng Liu, Cupertino, CA (US)

(73) Assignee: Synopsys, Inc., Sunnyvale, CA (US)

( * ) Notice: Subject to any disclaimer, the term of this patent is extended or adjusted under 35 U.S.C. 154(b) by 948 days.

(21) Appl. No.: 17/216,056

(22) Filed: Mar. 29, 2021

Related U.S. Application Data

(60) Provisional application No. 63/003,621, filed on Apr. 1, 2020.

(51) Int. Cl.
| | |
|---|---|
| *G06N 3/00* | (2023.01) |
| *G03F 1/36* | (2012.01) |
| *G03F 1/70* | (2012.01) |
| *G06N 3/045* | (2023.01) |
| *G06N 3/08* | (2023.01) |

(52) U.S. Cl.
CPC .................. *G03F 1/70* (2013.01); *G03F 1/36* (2013.01); *G06N 3/045* (2023.01); *G06N 3/08* (2013.01)

(58) Field of Classification Search
USPC ............................ 716/50, 51, 52, 53, 54, 55
See application file for complete search history.

(56) References Cited

U.S. PATENT DOCUMENTS

2020/0380362 A1* 12/2020 Cao .......................... G06N 3/08

OTHER PUBLICATIONS

Alawieh, M. B. et al., "GAN-SRAF: Sub-Resolution Assist Feature Generation Using Conditional Generative Adversarial Networks," ACM/IEEE Design Automation Conference (DAC), Jun. 2-6, 2019, six pages.

Cobb, N. B., "Fast Optical and Process Proximity Correction Algorithms for Integrated Circuit Manufacturing," Ph.D. dissertation, Graduate Division of the University of California at Berkeley, 1998, 139 pages.

Guajardo, M. et al., "Investigation of machine learning for dual OPC and assist feature printing optimization," SPIE Advanced Lithography, 2019, 11 pages, vol. 10962, No. 109620E.

Jeong, M. et al., "Pixel-based learning method for an optimized photomask in optical lithography," Journal of Micro/Nanolithography, MEMS, and MOEMS, Oct.-Dec. 2017, 12 pages, vol. 16, No. 4.

(Continued)

*Primary Examiner* — Brian Ngo
(74) *Attorney, Agent, or Firm* — Fenwick & West LLP

(57) ABSTRACT

A tensor-based computing platform performs mask synthesis. A method includes accessing a layout of a lithographic mask and estimating a printed pattern resulting from use of the lithographic mask in a lithographic process. The lithographic process is modeled by a sequence of at least two forward models. A first of the forward models uses the layout of the lithographic mask as input and a last of the forward models produces the estimated printed pattern as output. The method further includes modifying the layout of the lithographic mask based on differences between the estimated printed pattern and a target printed pattern. All of the forward models are implemented on the tensor-based computing platform.

18 Claims, 10 Drawing Sheets
(8 of 10 Drawing Sheet(s) Filed in Color)

(56) References Cited

OTHER PUBLICATIONS

Lin, Y. et al., "Machine learning for mask/wafer hotspot detection and mask synthesis," SPIE Photomask Technology and EUV Lithography, 2017, 14 pages, vol. 10451, No. 104510A.

Wang, S. et al., "Machine learning assisted SRAF placement for full chip," SPIE Photomask Technology and EUV Lithography, 2017, eight pages, vol. 10451, No. 104510D.

Watanabe, Y. et al., "Accurate Lithography Simulation Model Based on Convolutional Neural Networks," SPIE Advanced Lithography, Mar. 30, 2017, 10 pages, vol. 10147, No. 101470K.

Ye, W. et al., "LithoGAN: End-to-End Lithography Modeling with Generative Adversarial Networks," ACM/IEEE Design Automation Conference (DAC), Jun. 2-6, 2019, six pages.

Ye, W. et al., "TEMPO: Fast Mask Topography Effect Modeling with Deep Learning," ISPD '20: Proceedings of the 2020 International Symposium on Physical Design, Mar. 2020, pp. 127-134.

\* cited by examiner

US 12,181,793 B1

MASK SYNTHESIS USING TENSOR-BASED COMPUTING PLATFORMS

RELATED APPLICATION

This application claims the benefit of U.S. Provisional Application No. 63/003,621, "Mask Synthesis Based on Reinforcement Learning", filed Apr. 1, 2020, which is incorporated by reference in its entirety.

TECHNICAL FIELD

The present disclosure generally relates to a lithographic mask synthesis system. In particular, the present disclosure relates to a system and method for providing mask synthesis using a tensor-based computing platform.

BACKGROUND

One step in the manufacture of semiconductor wafers involves lithography. In a typical lithography process, a source produces light that is collected and directed by collection/illumination optics to illuminate a lithographic mask. Projection optics relay the pattern produced by the illuminated mask onto a wafer, exposing resist on the wafer according to the illumination pattern. The patterned resist is then used in a process to fabricate structures on the wafer.

Mask synthesis (MS) refers to the design of the lithographic masks that are used to print the semiconductor device patterns onto the resist films. Different types of mask synthesis tools are available from multiple tool vendors. However, different tools may have their own proprietary optimization algorithms and/or platforms, which may take a large amount of time and resources to develop and to maintain. Furthermore, the development of mask synthesis tools is becoming ever more difficult as masks grow larger, containing larger numbers of features that are smaller in size.

SUMMARY

Embodiments relate to performing mask synthesis using a tensor-based computing platform. In some embodiments, a method includes accessing a layout of a lithographic mask and estimating a printed pattern resulting from use of the lithographic mask in a lithographic process. The lithographic process is modeled by a sequence of at least two forward models. A first of the forward models uses the layout of the lithographic mask as input and a last of the forward models produces the estimated printed pattern as output. The method further includes modifying the layout of the lithographic mask based on differences between the estimated printed pattern and a target printed pattern. All of the forward models are implemented on the tensor-based computing platform.

In some embodiments, the sequence of forward models include at least one of: a mask model that estimates a near field resulting from an illuminating field applied to the lithographic mask; an imaging model that estimates an aerial image resulting from imaging of the near field onto a wafer; and a resist model that estimates the printed pattern resulting from the aerial image exposing a resist process.

In some embodiments, modifying the layout of the lithographic mask includes applying a mask synthesis model. The mask synthesis model relates modifications of the layout to differences between the estimated and target printed patterns and the mask synthesis model is also implemented on the tensor-based computing platform.

In some embodiments, a system includes a tensor-based computing platform. The tensor-based computing platform is configured to execute the at least two forward models and the mask synthesis model.

Other aspects include components, devices, systems, improvements, methods, processes, applications, computer readable mediums, and other technologies related to any of the above.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
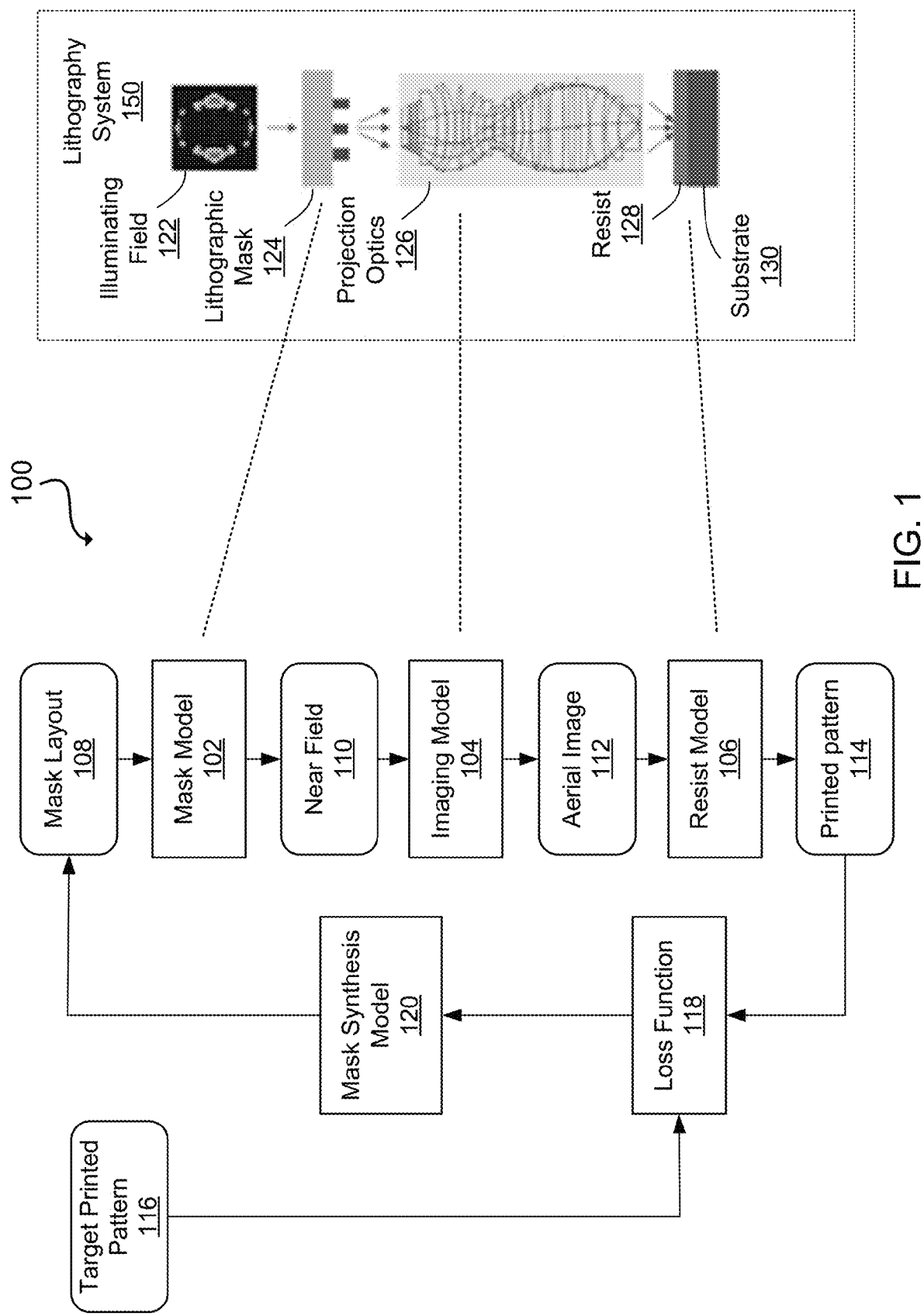
FIG. 1 is a flowchart of mask synthesis using a tensor-based computing platform in accordance with some embodiments of the present disclosure.

Aspects of the present disclosure relate to mask synthesis using tensor-based computing platforms. A tensor refers to a container that houses data in an arbitrary number of indices. A tensor is a generalization of scalars (that have no indices), vectors (that have one index), and matrices (that have two indices) to the arbitrary number of indices. Machine learning may be based on tensor operations, such as tensor multiplication and the application of other functions to tensors. Tensor multiplication may include Hadamard product or tensor product. Other tensor operations may include tensor addition, tensor subtraction, or tensor division. Hence, many machine learning platforms are tensor-based computing platforms. A tensor-based computing platform may include both software and hardware elements. It may include a software framework (e.g., including tools and software libraries) with instructions optimized for executing tensor multiplications or other types of tensor operations. These may be executed on hardware architectures (e.g., graphic processing units (GPUs) or tensor processing units (TPUs) that are optimized for the type of data flow and operations required by these instructions.

This disclosure relates to mask synthesis implemented on tensor-based computing platforms. In one approach, a lithographic mask is used in a lithographic process to produce a printed pattern on a wafer. In mask synthesis, the layout of the lithographic mask is optimized to produce the desired, target printed pattern. The lithographic process is modeled by a sequence of models, which for convenience are referred to as forward models. The first of the forward models uses the current layout of the lithographic mask as input, and the last of the forward models estimates the resulting printed pattern as output. The layout of the lithographic mask is modified based on differences between the estimated printed pattern and the target printed pattern. All of the forward models are implemented on tensor-based computing platform(s), thus taking advantage of the infrastructure developed for machine learning. The feedback to modify the lithographic mask may be provided by a mask synthesis model, which may also be compatible with tensor-based computing platforms.

As a result, a mask synthesis solution may run entirely on off-the-shelf open machine learning platforms (i.e., tensor-based computing platforms) that produce reliable results in varieties of applications. With an army of developers behind these platforms, this approach allows the developers of mask synthesis tools to save development effort in areas such as optimization engines, automatic loss function gradient calculation, hardware acceleration and job management, and to also take advantage of future advances in these areas. It also allows developers to focus more on the development of domain-specific components such as the ML platform-compatible lithography models that can be directly plugged into the tensor-based mask synthesis flow.

FIG. 1 is a flowchart of mask synthesis using a tensor-based computing platform. In a lithography system 150, a light source (not shown) produces a light distribution (the illuminating field 122) that is incident on a lithographic mask 124 having a mask layout. Light from the illuminating field 122 propagates through the lithographic mask 124, resulting in a light distribution referred to as the near field. That light is imaged by projection optics 126 onto resist 128 on a substrate 130 (e.g., a semiconductor wafer). The light distribution incident on the resist 128 is referred to as the aerial image. The aerial image exposes a resist process (e.g., including exposure, post-exposure bake (PEB), and development) that results in a printed pattern on the resist 128.

The tensor-based computing platform performs a forward flow that models the behavior of the lithography system 150 using a sequence of forward models. In particular, the forward models are used to determine an estimated printed pattern 114 from a mask layout 108. The tensor-based computing system also performs an inverse flow to improve the mask layout 108 by comparing the estimated printed pattern 114 to a target printed pattern 116.

The forward models may include a sequence of at least two forward models. A first of the forward models uses the mask layout 108 of the lithographic mask 124 as input and a last of the forward models produces the estimated printed pattern 114 as output. For example, the forward models may include a mask model 102 that estimates a near field 110 resulting from an illuminating field 122 being applied to a lithographic mask 124 having a mask layout 108, an imaging model 104 that estimates an aerial image 112 resulting from imaging of the near field 110 onto the resist 128, and a resist model 106 that estimates a printed pattern 114 in the resist resulting from the aerial image 112 exposing the resist process.

The mask model 102 estimates the diffracted near fields 110 of the lithographic mask 124 using the mask layout 108. In particular, the mask model 102 models the 3D topography effects in a mask diffraction process in order to predict behaviors such as critical dimension (CD), pattern shift, Bossung tilt and best focus shift, etc. The mask diffraction process is governed by Maxwell's equations. Although the mask diffraction process can be solved using a rigorous electromagnetic field (EMF) solver, use of the rigorous EMF solver is computationally expensive. As such, the mask model 102 may be a neural network (NN) model trained by supervised learning. For example, the mask model 102 approximates the diffraction process using a neural network that is trained via supervised learning using rigorously simulated training samples of mask layout inputs and corresponding near field outputs. In another example, the mask model 102 includes the computations of the rigorous EMF solver converted to using tensor multiplications and other tensor operations for implementation on the tensor-based computing platform.

The imaging model 104 estimates the aerial image 112 using the near field 110. The imaging model 104 may compute the aerial image 112 in the resist 128 caused by propagating the near field 110 through projection optics 126 into the wafer film stack. In some embodiments, the imaging model 104 is an Abbe imaging model or a Hopkins imaging model. For full-chip optical proximity correction (OPC) or inverse lithography technology (ILT) applications, the Hopkins imaging model in conjunction with singular value decomposition (SVD) may be used for its computational efficiency. In this approach, the original partially coherent imaging system is approximated by a truncated sum of coherent systems (SOCS). As a result, the aerial image 112 is computed as a sum of sub images, which are obtained from convolutions of imaging kernels with mask fields. The imaging model 104 may be generated by performing a decomposition to generate imaging kernels that use tensor operations for computation. Because of the use of tensor operations for the imaging kernels generated from the decomposition, the imaging model 104 can be implemented by the tensor-based computing platform.

The resist model 106 estimates the printed pattern 114 using the aerial image 112. To provide a reliable mask synthesis result, the resist model 106 captures various resist effects in exposure, post-exposure bake (PEB) and development process steps, including the resist shrinkage effect. In some embodiments, the resist model 106 is a neural network model that uses machine learning techniques such as supervised learning. In some embodiments, the resist model 106 includes an optical-only model that uses partial differential equations to describe these resist processes. Here, the resist process is modeled as applying a constant threshold on the aerial image to obtain resist contours. The computations of the partial differentiation equations are converted to tensor multiplications and other tensor operations for implementation on the tensor-based computing platform.

After the forward flow which uses the forward models to determine the estimated printed pattern 114, the inverse flow is performed to modify the mask layout 108 of the lithographic mask based on differences between the estimated printed pattern 114 and the target printed pattern 116. In the example of FIG. 1, the mask synthesis model 120 relates modifications of the mask layout 108 to the differences between the estimated printed pattern 114 and the target printed pattern 116. The mask synthesis model 120 uses a loss function 118 to quantify the differences according to one or more metrics. These metrics may be user-specified, and may include pattern fidelity, image contrast, edge placement error (EPE), sub-resolution assist feature (SRAF) or sidelobe printing, mask rule compliance (MRC), etc. The loss function 118 is used by the mask synthesis model 120 to determine the modifications to the mask layout 108, such as determining modifications that minimize the loss function. This process of forward and inverse flows may be repeated to improve the mask layout 108, such as until a user-specified stopping criterion is met.

An example of a loss function 118 is given by Equation 1, which is a weighted ($w_i$) sum of the squared differences between the printed pattern 114 ($I_i$) and the target printed pattern 116 ($I_i^*$) over evaluation points i.

$$\text{Loss} = \Sigma_i w_i (I_i - I_i^*)^2 \qquad (1)$$

In some embodiments, an estimated printed pattern 114 is defined by a resist image and a contour. The resist image that is compared to a resist image of the target printed pattern 116 and the contour is compared with a contour of the target printed pattern 116. A first loss function 118 may be determined for differences in the resist images and a second loss function 118 may be determined for differences in the contours. Additional terms may be included in a loss function 118 to incorporate quality metrics of interest, such as pattern fidelity, edge placement error (EPE), image log slope (ILS), image contrast, sidelobe printing, mask manufacturability, mask rule compliance (MRC), etc.

To modify the mask layout 108, the mask synthesis model 120 calculates a gradient of the loss function 118 with respect to the mask layout 108 using a backpropagation algorithm and updates the mask layout 108 using a stochastic gradient descent. The mask synthesis model 120 may be implemented on the same tensor-based computing platform as the forward models. The mask synthesis model 120 may use tensor multiplications and tensor operations to calculate the loss function gradient and perform the stochastic gradient descent. The tensor-based computing platform may also provide optimization related capabilities and other system level capabilities that are used by the mask synthesis model 120, such as optimization, hardware acceleration, automatic loss function gradient, and job management.

In some embodiments, the mask synthesis model 120 accounts for mask manufacturability. For example, a modified mask layout 108 may include features (e.g., sub-resolution assist features (SRAFs)) that are smaller than the resolution achievable by mask making processes. To make the mask more manufacturing friendly, the mask synthesis model 120 may include a mask rule control (MRC) regularization that adds a penalty to the loss function 118 when an MRC violation is detected. The mask synthesis model 120 may also include additional measure to reduce the complexity of the modified mask layout 108, such as applying a smoothing operation to reduce or remove high frequency components.

The sequence of forward models and the mask synthesis model 120 are implemented on the tensor-based computing platform. The tensor-based computing platform may include a software framework with a set of operations that include tensor multiplications and tensor operations. The software framework may include tools and software libraries with instructions optimized for executing the tensor multiplications and other tensor operations. The tensor-based computing platform may include a hardware architecture for the tensor multiplications and tensor operations, such as GPUs or application specific integrated circuits (ASICs) (e.g., TPUs) that are optimized for the type of data flow and operations required by these instructions. Each forward model may simulate a physical process and/or constraint based on a physical process (e.g., Maxwell's equations, diffraction, etc.). Each forward model includes a set of tensor multiplications and tensor operations that apply the physical processes or constraints to an input to generate an output. Furthermore, the forward models mask synthesis model 120 may leverage advances in the software and hardware of tensor-based computing platforms, such as optimization engines, hardware acceleration, and job management.

Although the forward models are implemented on a tensor-based computing platform, they may or may not be machine learning models. For example, the forward models may include a mix of one or more machine learning models and one or more non-machine learning models. A forward model that is a machine learning model may be trained by supervised learning. It may be in a form that includes tensor multiplications and tensor operations, and thus can be directly plugged into the tensor-based computing platform. A forward model that is not a machine learning model may include mathematical operations that are converted to use tensor multiplications and tensor operations to facilitate implementation on the tensor-based computing platform. In one example, the mask model 102 and resist model 106 are each a machine learning model trained by supervised learning while the imaging model 104 is not a machine learning model.

The forward models in the sequence are separable and are replaceable without requiring changes to other forward models in the sequence. For example, one or more of the mask model 102, the imaging model 104, and the resist model 106 may be replaced with models that use different architectures or operate in different ways so long as the inputs and outputs are compatible, or could be converted for compatibility. The use of multiple separable and replaceable sub-models in the forward flow as opposed to a single lumped model is a more natural and physical way to model the lithography process, and therefore is more stable and predictive. It also provides for the accounting and evaluation of various lithography effects (e.g., dose and focus variations) without having to re-train or re-calibrate the entire model.

In some embodiments, two or more of the forward models may be integrated into a single forward model. For example, the mask model 102 and the imaging model 104 may be integrated into a forward model that estimates the aerial image 112 using the mask layout 108. In another example, the imaging model 104 and the resist model 106 may be integrated into a forward model that estimates the printed pattern 114 using the near field 110. In another example, the mask model 102, imaging model 104, and resist model 106 may all be integrated into a forward model that estimates the printed pattern 114 using the mask layout 108.

Figure 2:
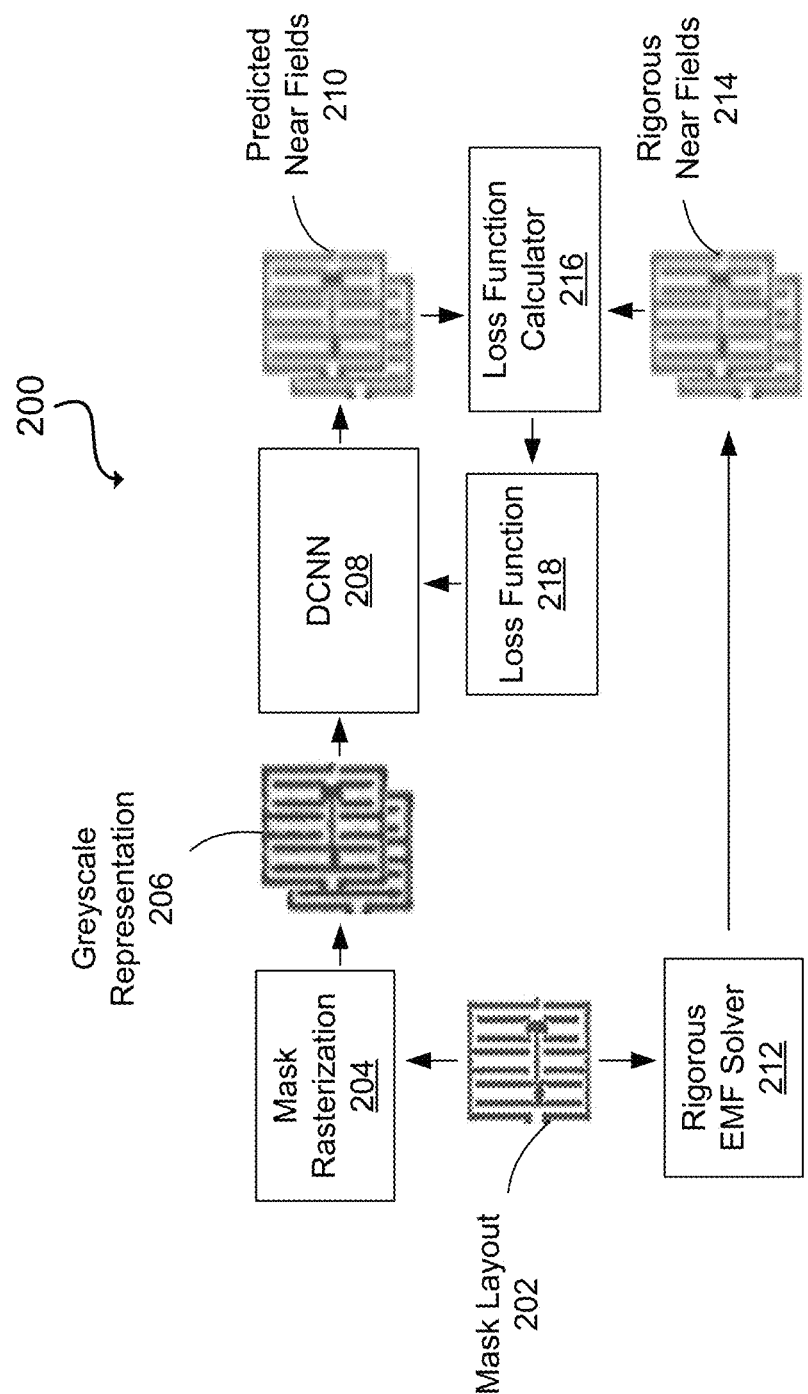
FIG. 2 shows a training flow to develop a deep convolution neural network (DCNN)-based three-dimensional (3D) mask model compatible with a tensor-based computing platform in accordance with some embodiments of the present disclosure.

FIG. 2 shows a training flow to develop a deep convolutional neural network (DCNN)-based 3D mask model compatible with the tensor-based computing platform. A mask layout 202, which may be defined using a file format such as Graphic Data System (GDS), is used to generate a mask rasterization 204. The mask rasterization 204 is used to generate a greyscale representation 206 of mask polygons. The greyscale representation 206 is provided as an input to the mask model, which in this example includes a DCNN 208, to generate predicted near fields 210. The DCNN 208 may model a 6% attenuated phase-shift mask (PSM), or some other type of mask such an alternating PSM or an attenuated PSM with a different transmission level. The mask layout 202 is also used by a rigorous EMF solver 212 to generate rigorous near fields 214. The rigorous EMF solver 212 may be a 3D finite-difference time-domain (FDTD) mask solver that generates rigorous near fields for different types of mask layouts including one-dimension (1D), regular two-dimension (2D), and freeform 2D patterns. A loss function calculator 216 determines a loss function 218 that defines a difference between the predicted near fields 210 and the rigorous near fields 214. The loss function 218 is used to update to the DCNN 208.

Figure 3:
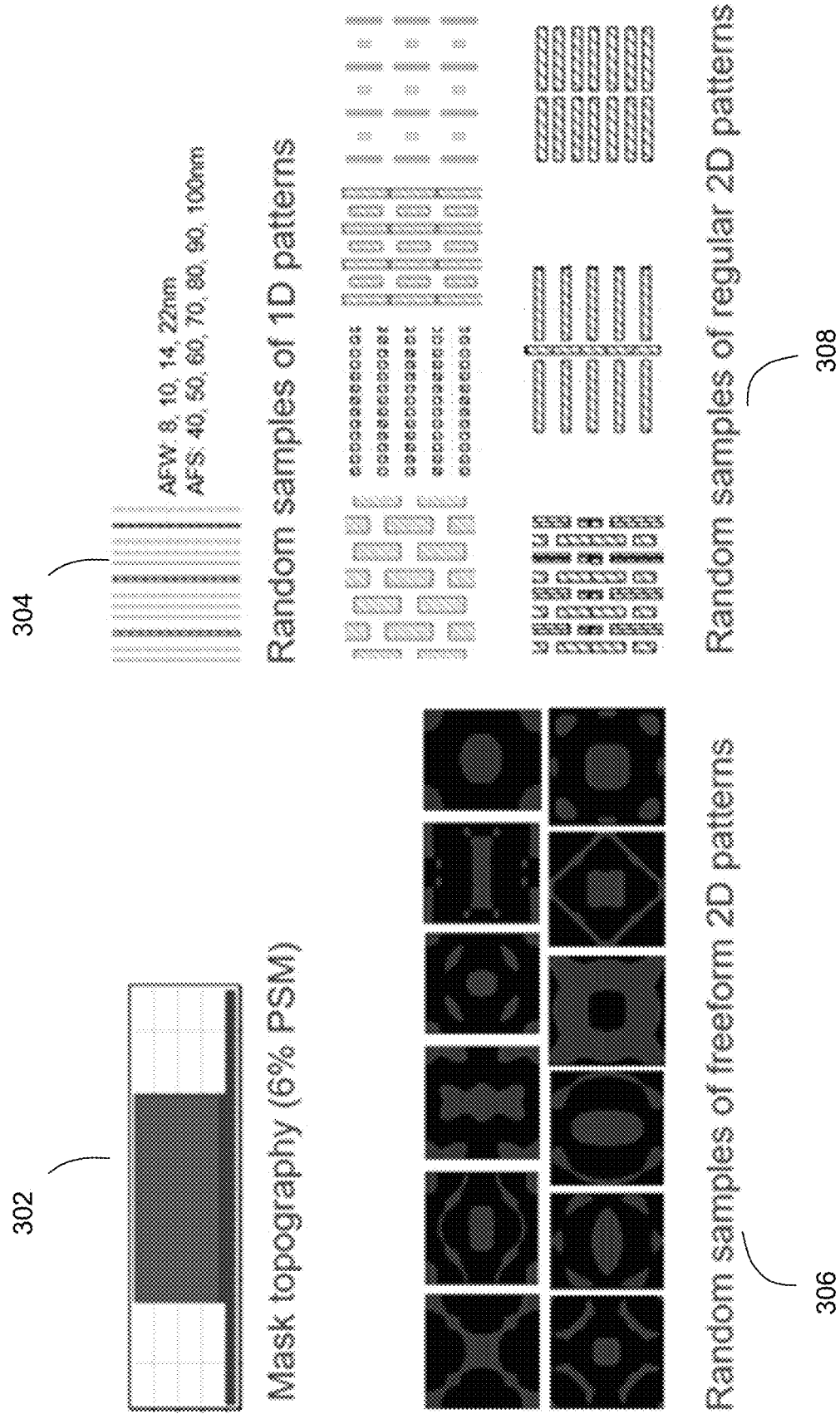
FIG. 3 shows a mask topography and examples of mask patterns in accordance with some embodiments of the present disclosure.

FIG. 3 shows a mask topography 302 and examples of mask layouts. The mask topography 302 is for a 6% attenuated PSM. The mask model 102 including DCNN 208 may be trained using different types of mask layouts 202 including 1D patterns 304, regular 2D patterns 306, and freeform 2D patterns 308. At least some (e.g., 50%) of these patterns may be randomly selected for the model training. AFW refers to assist feature width and AFS refers to assist feature space.

Figure 4:
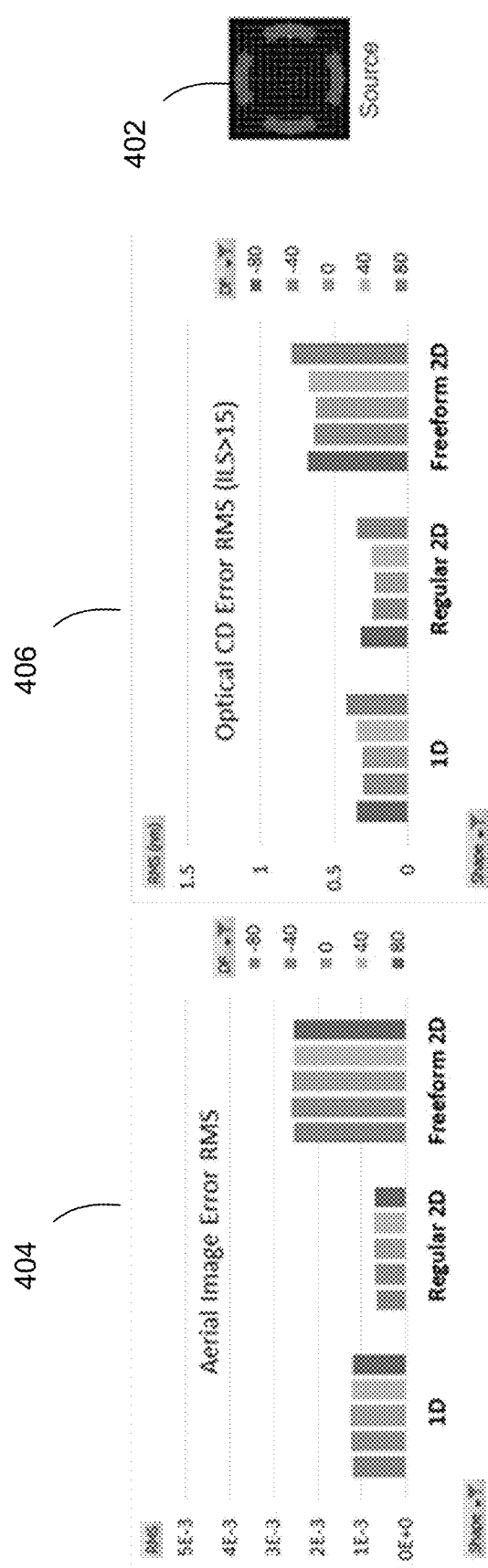
FIG. 4 shows 3D mask model errors for different types of patterns under different defocus (DF) conditions in accordance with some embodiments of the present disclosure.

FIG. 4 shows 3D mask model errors for different types of patterns under different defocus (DF) conditions. To assess accuracy of the predicted near fields 210 generated by the mas model 102 including the DCNN 208, the loss function calculator 216 may compute aerial images and optical critical dimensions (CDs) by passing the predicted near fields 210 through an imaging model of c-quad illumination source 402. Here, the aerial images refer to aerial images of the resist, and thus are also referred to as resist images. The loss function calculator 216 compares the aerial images with the rigorous near fields 214 to determine aerial image error root mean square (RMS) 404 for each of the 1D, regular 2D, and freeform 2D patterns under different defocus (DF) conditions. The loss function calculator 216 compares the optical CDs with the rigorous near fields 214 to determine optical CD error RMS 406 for each of the 1D, regular 2D, and freeform 2D patterns under the different DF conditions. As shown by the aerial image error RMS 404 and optical CD error RMS 406, the mask model of the DCNN 208 has good accuracy. Even though imaging models of different wafer defocus conditions are interchanged to obtain thru-focus aerial images, the mask model 102 may be designed to be independent of wafer defocus.

Figure 5:
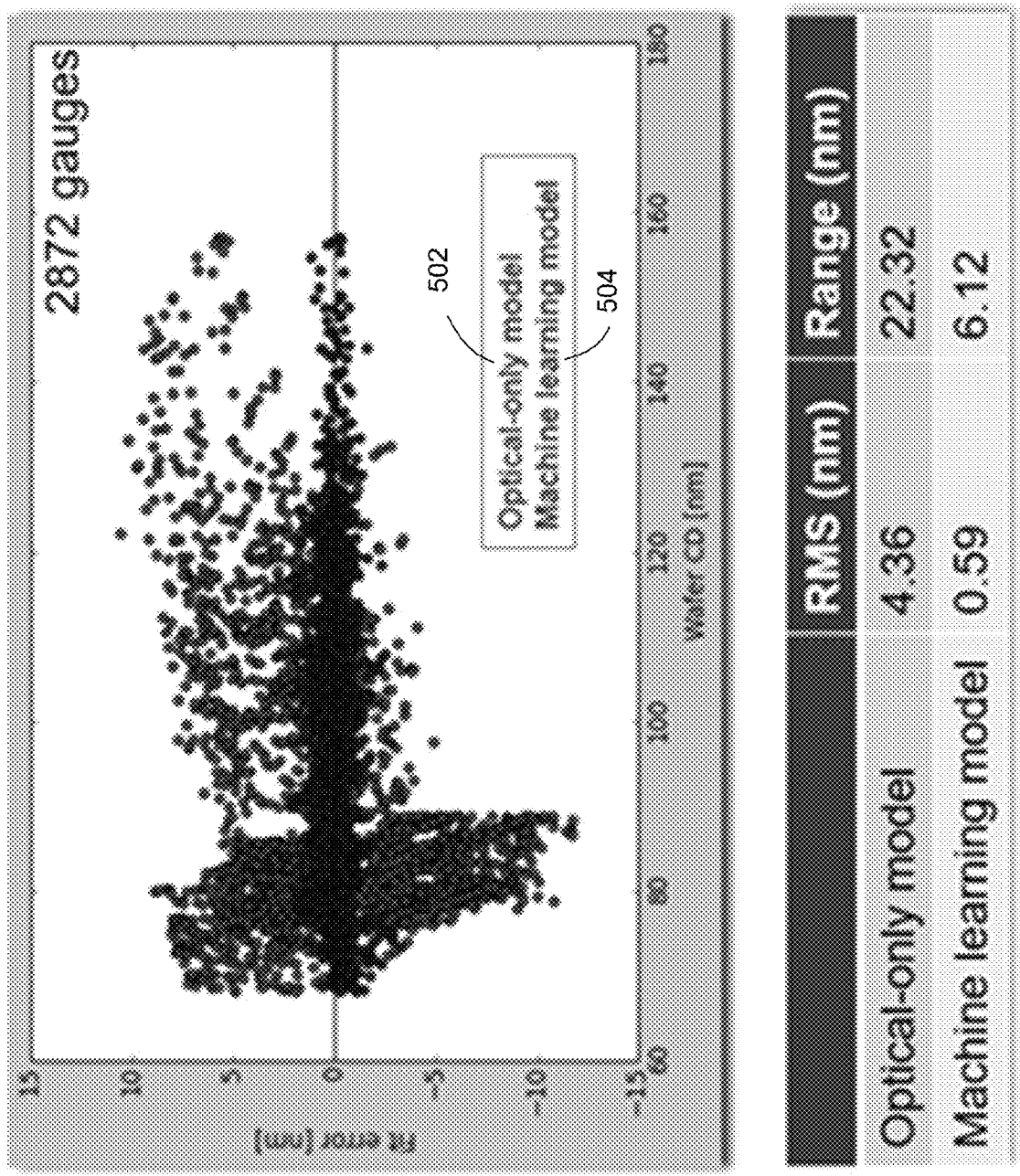
FIG. 5 plots accuracy of a neural network-based machine learning (ML) resist model in accordance with some embodiments of the present disclosure.

FIG. 5 plots accuracy of a neural network-based machine learning resist model 106 that is developed and trained using wafer data. The input to the resist model 106 is aerial images and the output is the printed pattern, as defined by resist images. Strong resist effects are evident in the wafer data as indicated by the large fit error of the optical-only model 502. The fit error is reduced by the NN-based resist model 106, shown as machine learning model 504, that uses tensor multiplications and operations. Because of the use of the tensor multiplications and operations, the resist model 106 can be implemented the tensor-based computing platform.

Figure 6A:
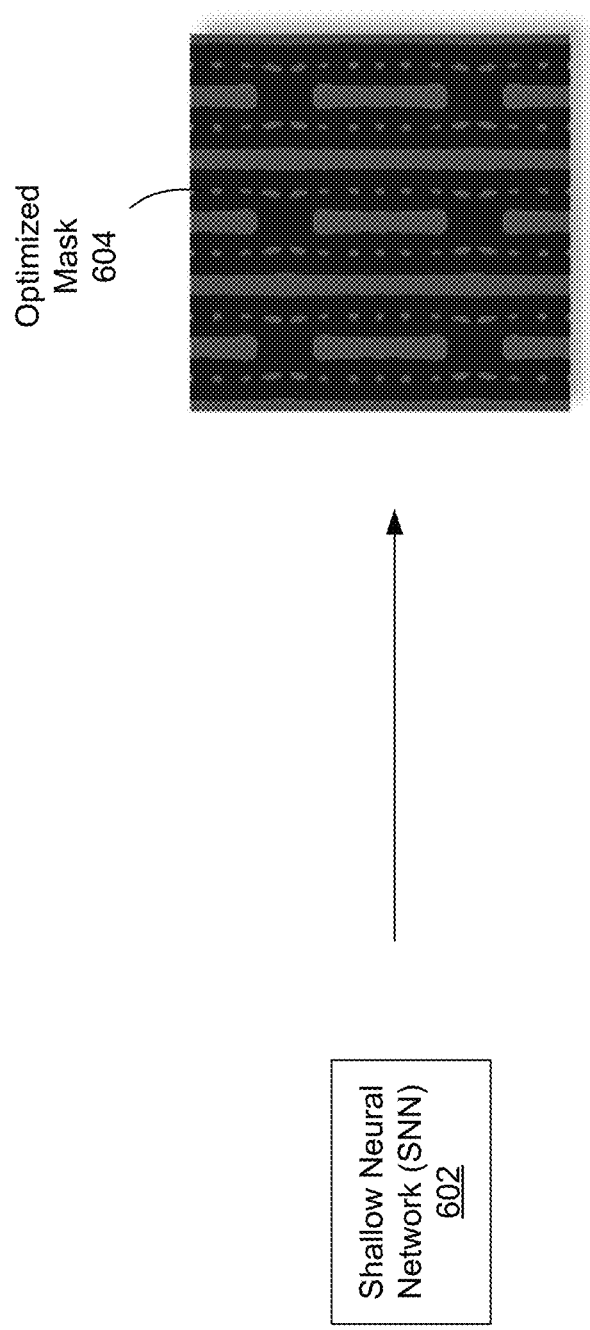
FIG. 6A depicts a shallow neural network (SNN) architecture for the mask synthesis model in accordance with some embodiments of the present disclosure.
Figure 6B:
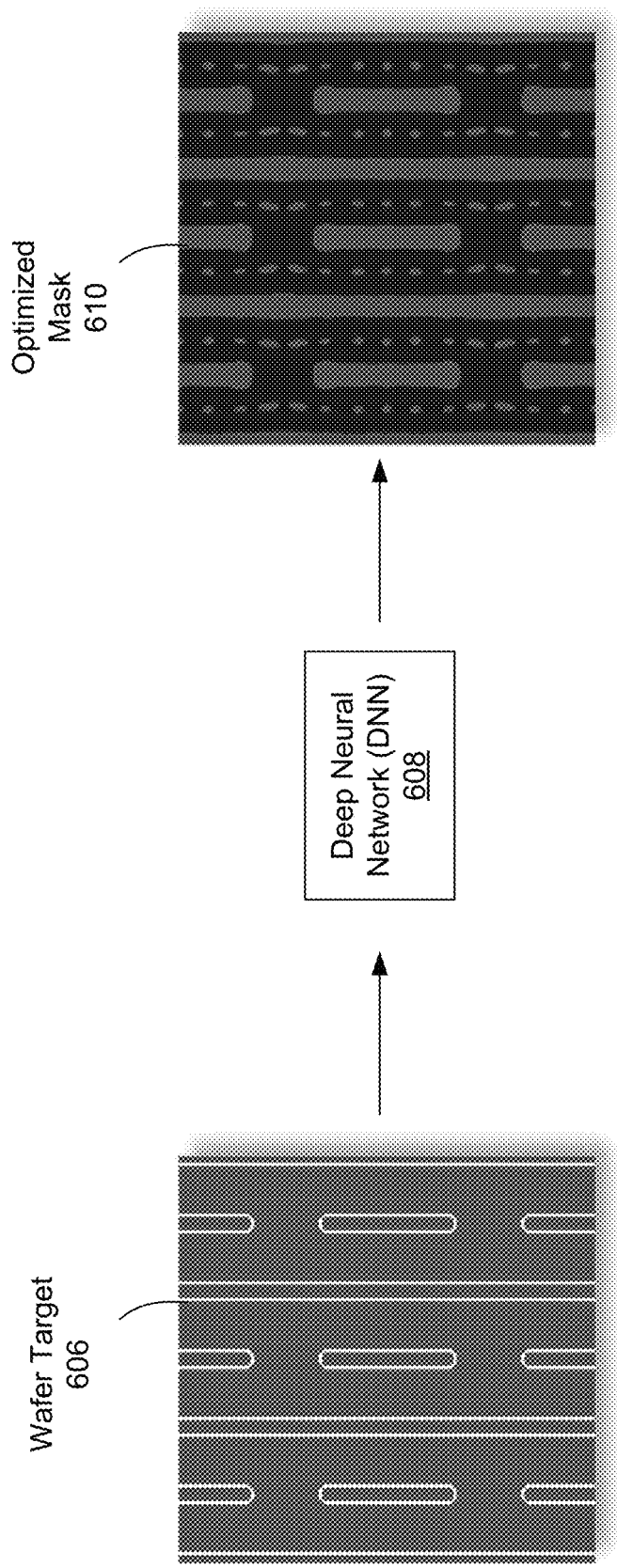
FIG. 6B depicts a deep neural network (DNN) architecture for the mask synthesis model in accordance with some embodiments of the present disclosure.
Figure 6C:
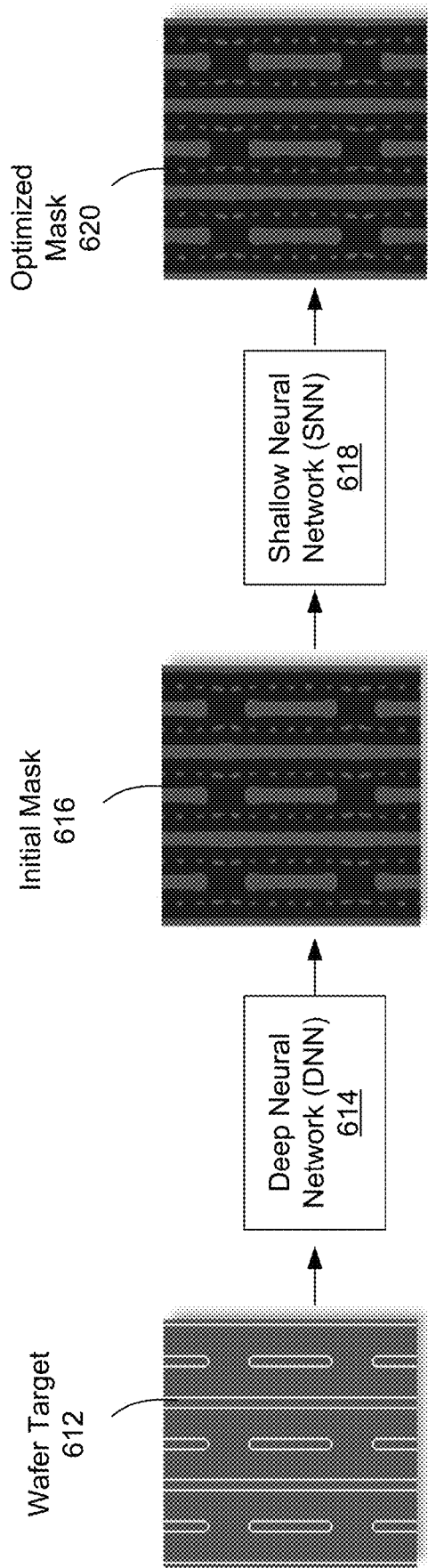
FIG. 6C depicts a hybrid architecture for the mask synthesis model in accordance with some embodiments of the present disclosure.

FIGS. 6A, 6B, and 6C depict different architectures for the mask synthesis model 120. With reference to FIG. 6A, the mask synthesis model 120 may include a shallow neural network (SNN) 602 that generates an optimized mask 604 that is a direct representation of the lithographic mask 124. With reference to FIG. 6B, the mask synthesis model 120 may include a deep neural network (DNN) 608, where the input layer is a wafer target 606 that represents the target printed pattern 116 and the output layer is an optimized mask 610 that represents the mask layout 108. The weights of the hidden layers may be trained as pattern independent and then used for arbitrary patterns, such as by using reinforcement learning. With reference to FIG. 6C, the mask synthesis model 120 may include a DNN 614 and an SNN 618. The DNN 614 generates an initial mask layout 616 from a wafer target 612 and the SNN 618 generates an optimized mask 620 by tuning the initial mask layout 616.

The SNN 602 is a basic architecture that is pattern specific and optimized per pattern to obtain high quality. The DNN 608 is a complex architecture that is fast in applications but may result in worse quality than the SNN 602. The DNN 614 and SNN 618 used together is a hybrid architecture, where the complex architecture of the DNN 614 quickly generates a high-quality initial mask, followed by the basic architecture fine tuning the initial mask for increased quality. An SNN may include a fewer number of hidden layers than a DNN. For example, the SNN 602 and SNN 618 may each include a single hidden layer, or two hidden layers, while the DNN 608 and 614 may include more hidden layers than each of the SNN 602 or SNN 618.

Figure 7:
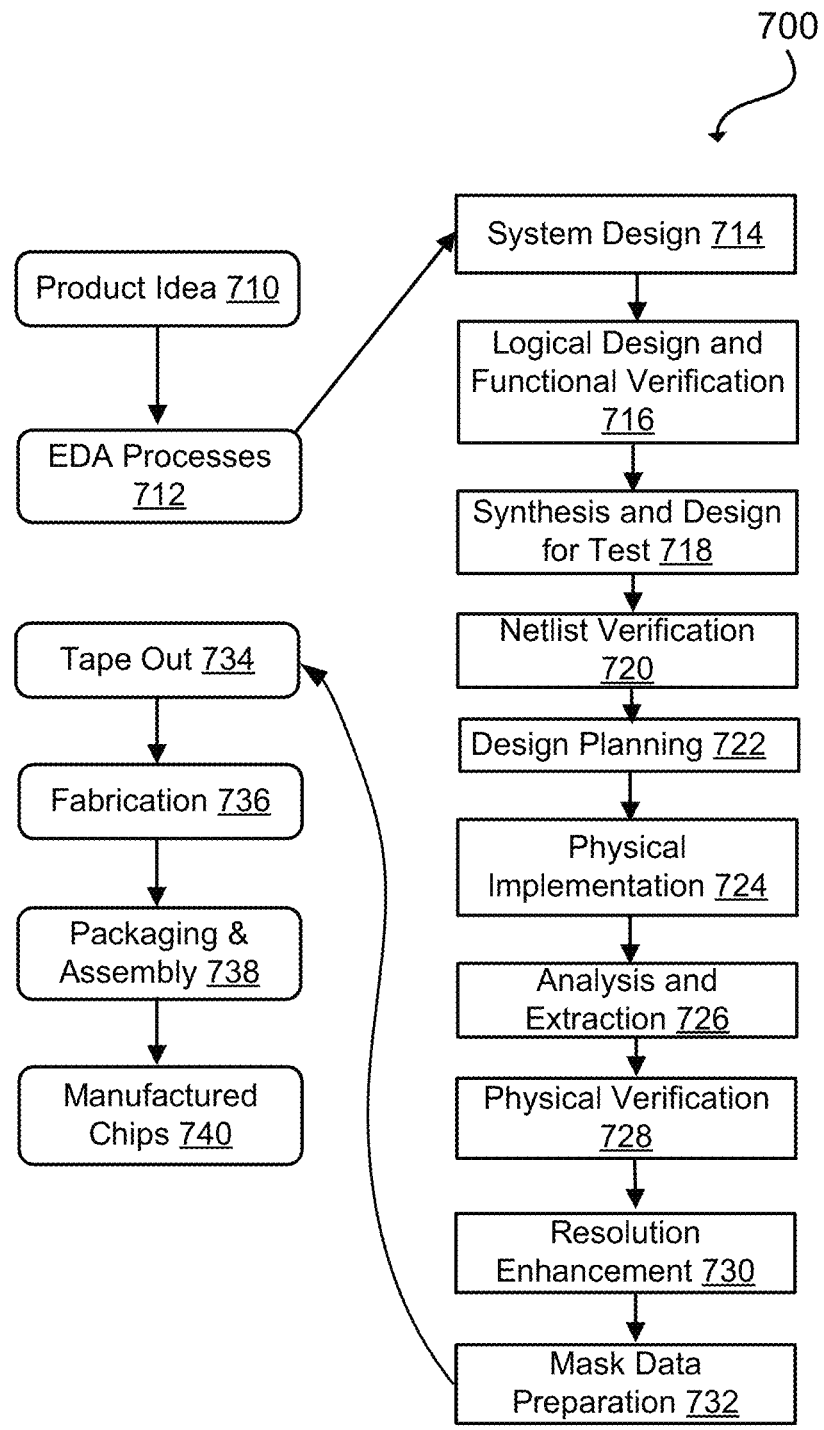
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
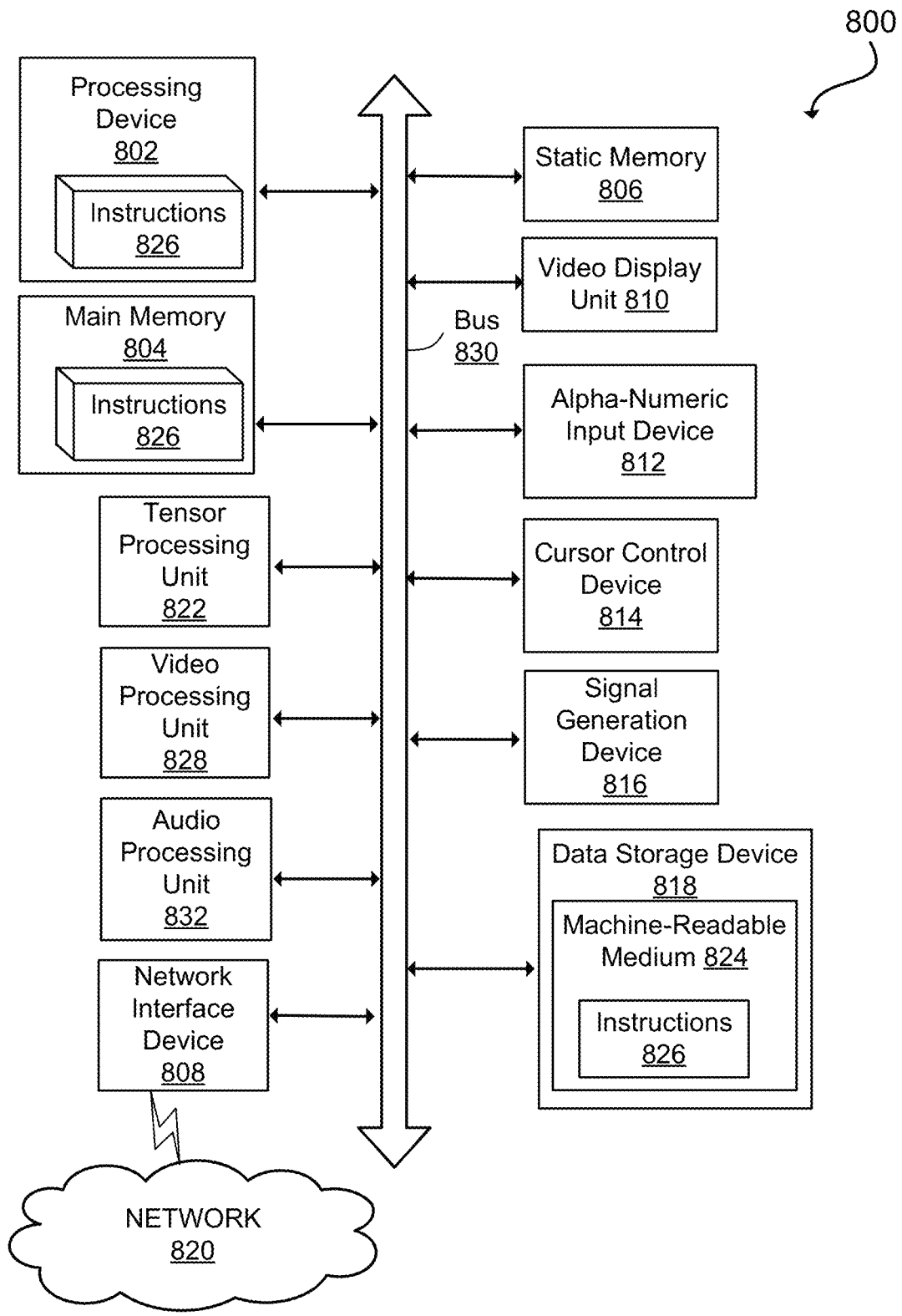
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a tensor processing unit 822, a signal generation device 816 (e.g., a speaker), video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

The computer system 800 may implement a tensor-based computing platform for mask synthesis. For example, the processing device 802, based on executing the instructions 826, may control the performance of the forward flow using the forward models (e.g., mask model 102, imaging model 104, and resist model 106) and the inverse flow using the mask synthesis model 120.

The tensor processing unit 822 may provide hardware acceleration for execution of the tensor multiplications and other tensor operations used by the forward models and mask synthesis model 120. The tensor processing unit 822 includes hardware that performs the tensor operations faster and more efficiently than the processing device 802. For example, the tensor processing unit 822 may include a set of arithmetic logic units (ALUs), each ALU including multipliers and adders. The tensor processing unit 822 may be a GPU, an ASIC (e.g., a TPU) or a field-programmable gate arrays (FPGA).

For each model implemented on the tensor-based computing platform, the processing device 802 may provide input data and instructions for the tensor operations to one or more tensor processing units 822. The input data may be stored in the main memory 804 and provided to the tensor processing unit 822 via the bus 830. The output of the tensor processing unit 822 may be provided as input to the tensor processing unit 822 or another tensor processing unit 822 (e.g., for additional tensor operations) or may be provided to the main memory 804 for storage and further processing by the processing device 802.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A method comprising:
    accessing a layout of a lithographic mask;

estimating a printed pattern resulting from use of the lithographic mask in a lithographic process, wherein the lithographic process is modeled by a sequence of at least two forward models, a first of the forward models using the layout of the lithographic mask as input and a last of the forward models producing the estimated printed pattern as output; and applying a mask synthesis model to modify the layout of the lithographic mask based on differences between the estimated printed pattern and a target printed pattern;

wherein the mask synthesis model includes a deep neural network followed by a shallow neural network, the deep neural network has more hidden layers than the shallow neural network, and the shallow neural network is pattern specific and has not more than two hidden layers;

wherein the sequence of at least two forward models and the mask synthesis model are implemented on a tensor-based computing platform.

2. The method of claim 1, wherein the sequence of forward models comprises at least one of:
a mask model that estimates a near field resulting from an illuminating field applied to the lithographic mask;
an imaging model that estimates an aerial image resulting from imaging of the near field onto a wafer; and
a resist model that estimates the printed pattern resulting from the aerial image exposing a resist process.

3. The method of claim 1, wherein the forward models in the sequence are separable and are replaceable without requiring changes to the other forward models in the sequence.

4. The method of claim 1, wherein at least one of the forward models includes constraints based on a physical process modeled by the forward model.

5. The method of claim 1, wherein at least one of the forward models is based on a physical process modeled by the forward model.

6. The method of claim 1, wherein at least one of the forward models is a machine learning model trained by supervised learning.

7. The method of claim 1, wherein at least one of the forward models is not a machine learning model trained by supervised learning.

8. The method of claim 1 wherein the sequence of forward models consists of:
a mask model that estimates a near field resulting from an illuminating field applied to the lithographic mask, wherein the mask model is a neural network model trained by supervised learning;
an Abbe or Hopkins imaging model that estimates an aerial image resulting from imaging of the near field onto a wafer; and
a resist model that estimates the printed pattern resulting from the aerial image exposing a resist process, wherein the resist model is also a neural network model trained by supervised learning.

9. The method of claim 1, wherein the mask synthesis model is based on a gradient of a loss function between the estimated and target printed patterns.

10. A system comprising:
a memory storing instructions; and
a tensor-based computing platform, coupled with the memory and to execute the instructions, the instructions when executed cause the tensor-based computing platform to:
execute a sequence of at least two forward models to estimate a printed pattern resulting from use of a lithographic mask in a lithographic process, wherein a first of the forward models uses a layout of the lithographic mask as input and a last of the forward models produces the estimated printed pattern as output; and
execute a mask synthesis model to modify the layout of the lithographic mask based on differences between the estimated printed pattern and a target printed pattern; wherein the mask synthesis model includes a deep neural network followed by a shallow neural network, the deep neural network has more hidden layers than the shallow neural network, and the shallow neural network is pattern specific and has not more than two hidden layers.

11. The system of claim 10, wherein the tensor-based computing platform comprises a software framework comprising tensor multiplications and tensor operations.

12. The system of claim 10, wherein the tensor-based computing platform comprises a hardware architecture configured for tensor multiplications and tensor operations.

13. The system of claim 10, wherein the sequence of forward models comprises at least one of:
a mask model that estimates a near field resulting from an illuminating field applied to the lithographic mask;
an imaging model that estimates an aerial image resulting from imaging of the near field onto a wafer; and
a resist model that estimates the printed pattern resulting from the aerial image exposing a resist process.

14. The system of claim 10, wherein:
at least one of the forward models is a machine learning model trained by supervised learning; and
at least another one of the forward models is not a machine learning model trained by supervised learning.

15. A non-transitory computer readable medium comprising stored instructions, which when executed by a processor, cause the processor to:
access a layout of a lithographic mask;
estimate a printed pattern resulting from use of the lithographic mask in a lithographic process, wherein the lithographic process is modeled by a sequence of at least two forward models, a first of the forward models using the layout of the lithographic mask as input and a last of the forward models producing the estimated printed pattern as output; and
execute a mask synthesis model to modify the layout of the lithographic mask based on differences between the estimated printed pattern and a target printed pattern, wherein the mask synthesis model includes a deep neural network followed by a shallow neural network, the deep neural network has more hidden layers than the shallow neural network, and the shallow neural network is pattern specific and has not more than two hidden layers;
wherein all of the forward models and the mask synthesis model use tensor multiplications and tensor operations.

16. The computer readable medium of claim 15, wherein the sequence of forward models comprises at least one of:
a mask model that estimates a near field resulting from an illuminating field applied to the lithographic mask;
an imaging model that estimates an aerial image resulting from imaging of the near field onto a wafer; and
a resist model that estimates the printed pattern resulting from the aerial image exposing a resist process.

17. The computer readable medium of claim 15, wherein the forward models in the sequence are separable and are replaceable without requiring changes to the other forward models in the sequence.

18. The computer readable medium of claim 15, wherein at least one of the forward models is a machine learning model trained by supervised learning.

* * * * *